United States Patent
Jiao

(10) Patent No.: US 10,763,448 B2
(45) Date of Patent: Sep. 1, 2020

(54) OLED DEVICE WITH BUFFER LAYER ADJACENT LIGHT EMITTING LAYER

(71) Applicant: BOE TECHNOLOGY GROUP CO., LTD., Beijing (CN)

(72) Inventor: Zhiqiang Jiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/117,781

(22) Filed: Aug. 30, 2018

(65) Prior Publication Data
US 2019/0115551 A1 Apr. 18, 2019

(30) Foreign Application Priority Data

Oct. 16, 2017 (CN) .......................... 2017 1 0958625

(51) Int. Cl.
*H01L 51/50* (2006.01)
*H01L 51/56* (2006.01)

(52) U.S. Cl.
CPC ...... *H01L 51/5008* (2013.01); *H01L 51/5056* (2013.01); *H01L 51/5072* (2013.01); *H01L 51/56* (2013.01); *H01L 51/5088* (2013.01); *H01L 51/5092* (2013.01); *H01L 51/5096* (2013.01); *H01L 2251/5346* (2013.01)

(58) Field of Classification Search
CPC .......................... H01L 51/5008; H01L 51/5096
See application file for complete search history.

(56) References Cited

U.S. PATENT DOCUMENTS

| 6,495,198 | B2* | 12/2002 | Peng | H01L 51/5008 |
| | | | | 204/192.1 |
| 6,951,694 | B2* | 10/2005 | Thompson | C09K 11/06 |
| | | | | 313/504 |
| 7,342,355 | B2* | 3/2008 | Seo | H01L 51/5012 |
| | | | | 313/504 |
| 8,354,787 | B2* | 1/2013 | Kim | H01L 51/5008 |
| | | | | 313/504 |
| 2011/0068331 | A1* | 3/2011 | Koh | H01L 51/5008 |
| | | | | 257/40 |
| 2012/0267619 | A1* | 10/2012 | Yamada | H01L 51/5004 |
| | | | | 257/40 |
| 2014/0295603 | A1* | 10/2014 | Kakiuchi | H01L 51/5008 |
| | | | | 438/46 |

FOREIGN PATENT DOCUMENTS

WO    WO-2013002051 A1 *    1/2013    ......... H01L 51/5008

* cited by examiner

*Primary Examiner* — Daniel Luke
(74) *Attorney, Agent, or Firm* — Dinsmore & Shohl LLP

(57) ABSTRACT

This application relates to an OLED device, a manufacturing method thereof, and a display device. The OLED device includes a light emitting unit between an anode and a cathode. The light-emitting unit includes: a first carrier function layer for migration of first carriers, the first carrier function layer including a first material layer; a second carrier function layer for migration of second carriers having a polarity different from that of the first carriers, the second carrier function layer including a second material layer; a light emitting layer between the first material layer and the second material layer, the light emitting layer including a luminescent material; a first buffer layer between the light emitting layer and the first material layer. The first buffer layer is a mixed layer containing the luminescent material and the first material.

9 Claims, 3 Drawing Sheets

OLED DEVICE WITH BUFFER LAYER ADJACENT LIGHT EMITTING LAYER

CROSS-REFERENCE TO RELATED APPLICATIONS

The present application claims priority to Chinese Patent Application No. 201710958625.2 filed on Oct. 16, 2017, the disclosure of which is hereby incorporated by reference in the present application in its entirety.

TECHNICAL FIELD

This disclosure relates to the technical field of display, in particular to an OLED (Organic Light Emitting Diode) device, a method of manufacturing the same and a display device.

BACKGROUND

Due to the advantageous characteristics such as self-illumination, high contrast, wide viewing angle, low power consumption, fast response and low manufacturing cost, etc., OLED devices have received more and more attention as the basis of next-generation display devices.

In recent years, considerable research and development has laid a solid foundation for large-scale application of OLED devices. Currently, related OLED display and lighting products have appeared on the market. However, although the OLED device manufacturing technology has been more mature, the performance of the device remains the key issue of restricting it to large-scale applications.

SUMMARY

According to a first aspect of embodiments of the present disclosure, an OLED device, which comprises a light emitting unit between an anode and a cathode, is provided. The light-emitting unit comprises: a first carrier function layer for migration of first carriers, the first carrier function layer comprising a first material layer having a first material; a second carrier function layer for migration of second carriers having a polarity different from that of the first carriers, the second carrier function layer comprising a second material layer having a second material; and a light-emitting layer between the first material layer and the second material layer, which contains a luminescent material. The light emitting layer also comprises a first buffer layer between the light emitting layer and the first material layer, the first buffer layer being a mixed layer containing the luminescent material and the first material.

In some embodiments, the first buffer layer is a multi-layer structure in which content of the luminescent material gradually decreases in a direction from the light emitting layer to the first material layer.

In some embodiments, the light emitting layer also comprises a second buffer layer between the light emitting layer and the second material layer, the second buffer layer being a mixed layer containing the luminescent material and the second material.

In some embodiments, the second buffer layer is a multi-layer structure in which content of the luminescent material gradually decreases in a direction from the light emitting layer to the second material layer.

In some embodiments, the first material comprises a first injecting material for injecting the first carriers, a first transporting material for transporting the first carriers, or a first blocking material for blocking the second carriers.

In some embodiments, the second material comprises a second injecting material for injecting the second carriers, a second transporting material for transporting the second carriers, or a second blocking material for blocking the first carriers.

In some embodiments, the first carrier function layer comprises a first carrier injecting layer, a first carrier transporting layer and a second carrier blocking layer.

In some embodiments, the second carrier function layer comprises a second carrier injecting layer, a second carrier transporting layer and a first carrier blocking layer.

According to a second aspect of embodiments of this disclosure, a display device comprising the aforementioned OLED device is provided.

According to a third aspect of embodiments of this disclosure, a method of manufacturing an OLED device, which comprises forming an anode, a light emitting unit and a cathode on a substrate, is provided. Forming the light emitting unit comprises: forming a first carrier function layer for migration of first carriers, the first carrier function layer comprising a first material layer having a first materail; forming a light emitting layer comprising a luminescent material; forming a second carrier function layer for migration of second carriers having a polarity different from that of the first carriers, the second carrier function layer comprising a second material layer having a second material. Forming the light emitting layer also comprises forming a first buffer layer between the light emitting layer and the first material layer, the first buffer layer being a mixed layer containing the luminescent material and a first material.

In some embodiments, the first buffer layer is a multi-layer structure in which content of the luminescent material gradually decreases in a direction from the light emitting layer to the first material layer.

In some embodiments, the first buffer layer is a multi-layer structure in which content of the luminescent material gradually decreases in a direction from the light emitting layer to the first material layer.

In some embodiments, forming the light emitting layer also comprises forming a second buffer layer between the light emitting layer and the second material layer, the second buffer layer being a mixed layer containing the luminescent material and a second material.

In some embodiments, the second buffer layer is a multi-layer structure in which content of the luminescent material gradually decreases in a direction from the light emitting layer to the second material layer.

In some embodiments, the first material comprises a first injecting material for injecting the first carriers, a first transporting material for transporting the first carriers, or a first blocking material for blocking the second carriers.

In some embodiments, the second material comprises a second injecting material for injecting the second carriers, a second transporting material for transporting the second carriers, or a second blocking material for blocking the first carriers.

In some embodiments, the first carrier function layer comprises a first carrier injecting layer, a first carrier transporting layer and a second carrier blocking layer.

In some embodiments, the second carrier function layer comprises a second carrier injecting layer, a second carrier transporting layer and a first carrier blocking layer.

Further features of the present disclosure, as well as advantages thereof, will become clearer from the following detailed description of exemplary embodiments of the present disclosure with reference to the accompanying drawings.

BRIEF DESCRIPTION OF THE DRAWINGS

The accompanying drawings, which constitute a part of the specification, illustrate embodiments of the present disclosure and, together with the description, serve to explain the principles of the present disclosure.

The present disclosure may be understood more clearly from the following detailed description with reference to the accompanying drawings, wherein.

Figure 1:
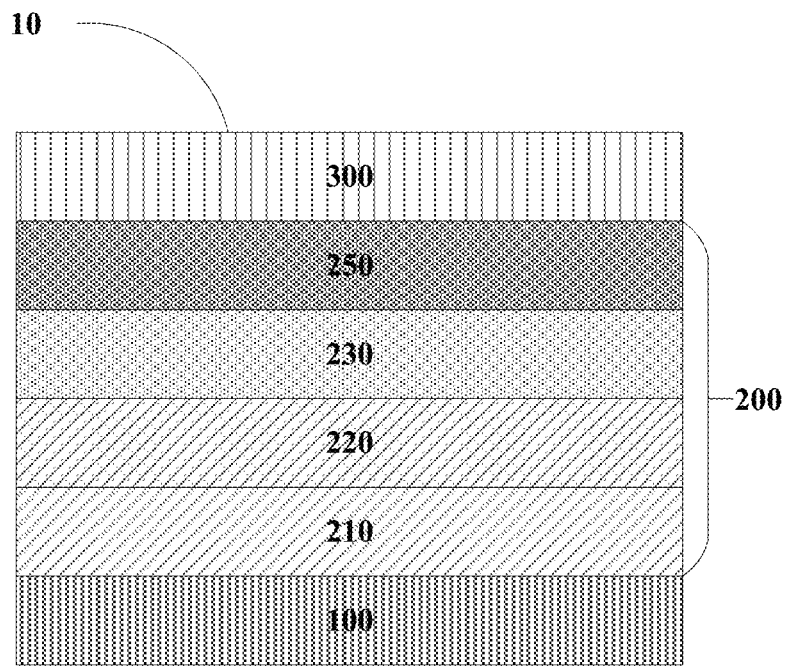
FIG. 1 is a structural diagram of an OLED device according to some embodiments of the present disclosure.

It should be understood that the dimensions of the various parts shown in the drawings are not drawn according to the actual proportional relationship. In addition, the same or similar reference signs denote the same or similar components.

DETAILED DESCRIPTION

The exemplary embodiments of the present disclosure will be described in detail with reference to the accompanying drawings. The description of the exemplary embodiments is intended to be merely illustrative, and is not meant to be limitation on the present disclosure and its application or use in any way. The present disclosure may be implemented in many different forms, not limited to the embodiments described herein. These embodiments are provided so that this disclosure will be thorough and complete, and will fully convey the scope of the disclosure to those skilled in the art. It should be noted that, unless otherwise specified, relative arrangement of components and steps, ingredients of the materials, numerical expressions and numerical values set forth in these embodiments are to be construed as merely illustrative, not as a limitation.

The terms "first", "second" and similar words used in the present disclosure do not denote any order, quantity, or importance, but merely serve to distinguish different parts. Similar words like "comprise" or "comprise" mean that the element that precedes the word covers the elements listed after that term, but does not exclude the possibility of also covering other elements. "Up", "Down", "Left", "Right", and the like are used only to indicate a relative positional relationship, and when the absolute position of the described object is changed, the relative positional relationship may also change correspondingly.

In the present disclosure, when it is described that a specific component is located between a first component and a second component, an intervening component may exist between the specific component and the first or second component, or there may be no intervening component. When it is described that a specific component is connected to other components, the specific component may be directly connected with the other components without having an intervening component therebetween, or may not be directly connected with the other components but have an intervening component therebetween.

Unless otherwise specifically defined, all terms (comprising technical terms or scientific terms) used in the present disclosure have the same meanings as understood by an ordinary person skilled in the art to which the present disclosure belong. It will also be understood that terms defined in, for example, common dictionaries should be interpreted as having meanings that are consistent with their meanings in the context of the relevant art, and should not be interpreted in an idealized or extremely formal sense unless expressly defined here.

Techniques, methods, and devices known to an ordinary person skilled in the relevant art may not be discussed in detail but, where appropriate, such techniques, methods, and devices are to be considered part of the description.

After study, it has been found that the performance of OLED devices mainly depends on light emission efficiency and device lifetime, for example: factors such as insufficient use of excitons in the device limit improvement of the light emission efficiency; instability of the interface between different materials in the device may easily lead to device failure, thereby reducing device lifetime.

To solve the above mentioned problem, the present disclosure proposes a structure that can both improve the utilization of excitons and improve the stability of the interface.

FIG. 1 is a structural diagram of an OLED device 10 according to some embodiments of the present disclosure.

As illustrated by FIG. 1, the OLED device 10 comprises a light emitting unit 200 positioned between two electrodes 100 and 300, an anode and a cathode. The light emitting unit 200 comprises: a first carrier function layer 210 for migration of first carriers; a second carrier function layer 250 for migration of second carriers; and a light emitting layer 230 containing a luminescent material, positioned between the first carrier function layer 210 and the second carrier function layer 250. The first carrier function layer 210 comprises a material layer adjacent to the light emitting layer 230, referred to as a first material layer. The second carrier function layer 250 also comprises a material layer adjacent to the light emitting layer 230, referred to as a second material layer. In other words, the light emitting layer 230 is positioned between the first and second material layers.

As shown in FIG. 1, the light emitting unit 200 also comprises a first buffer layer 220 positioned between the light emitting layer 230 and the first material layer (i.e., the first carrier function layer 210). The first buffer layer 220 is a mixed layer containing a luminescent material and the first material.

Here, the first carriers may be either holes or electrons, and the same is true for the second carriers, as long as the polarities of the first and second carriers are different from each other. Accordingly, since the first and second materials can realize the corresponding functions of the first and second carrier function layers, they belong to different materials.

In the following text, unless otherwise specified, description will be made by taking as an example that the first carriers are holes and the second carriers are electrons. In this case, reference signs 210 and 250 in FIG. 1 correspond to a hole function layer and an electron function layer, respectively, and 100 and 300 correspond to an anode and a cathode, respectively, and the first buffer layer 220 is positioned between the light emitting layer 230 and the hole function layer 210. Of course, the opposite can also be the case where the first carriers are electrons and the second carriers are holes. Correspondingly, the meanings of the reference signs in FIG. 1 may vary, respectively, that is, 210 and 250 correspond to electron function layer and hole function layer, respectively, and 100 and 300 correspond to an anode and a cathode, respectively, and the first buffer layer 220 is positioned between the light emitting layer 230 and the electron function layer 210. That is to say, the first buffer layer may be positioned between the light emitting layer and the electron function layer, and may also be positioned between the light emitting layer and the hole function layer.

In the above embodiments, since the first buffer layer is made of a mixed material of a luminescent material and a first material, when it is placed between the light emitting layer and the first material layer, stability of the interface between the light emitting layer and the first material layer can be improved. Moreover, in the first buffer layer, the unused excitons in the light emitting layer can also be used over again for light emission so as to improve the utilization of excitons.

Figure 2:
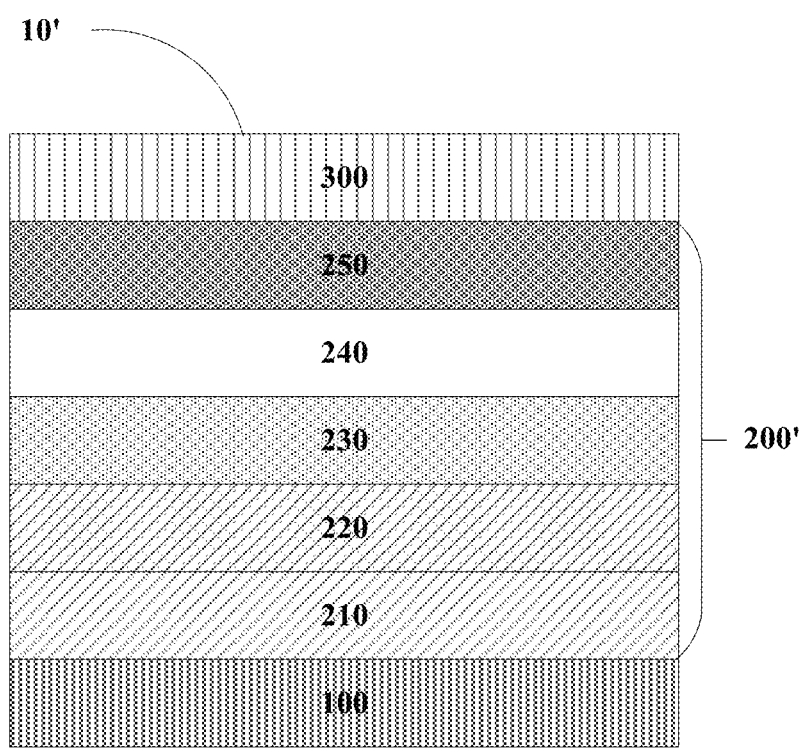
FIG. 2 is a structural diagram of an OLED device according to some other embodiments of the present disclosure.

FIG. 2 is a structural diagram of an OLED device 10' according to some other embodiments of the present disclosure.

The OLED device 10' in FIG. 2 differs from the OLED device 10 in FIG. 1 in that the former not only comprises a first buffer layer 220 between the light emitting layer 230 and the first carrier function layer 210 but also comprises a second buffer layer 240 between the light emitting layer 230 and the second carrier function layer 250. The second buffer layer 240 is a mixed layer containing a luminescent material and a second material.

Since the second buffer layer is made of a mixed material of a luminescent material and a second material, when it is placed between the light emitting layer and the second material layer, stability of the interface between the light emitting layer and the second material layer can be improved thereby to lengthen the device lifetime. Moreover, in the second buffer layer, the unused excitons in the light emitting layer can also be used over again for light emission so as to improve the utilization of excitons thereby improving the efficiency of light emission. Therefore, as compared with providing a buffer layer only between the light emitting layer and a carrier function layer on one side, providing corresponding buffer layers between the light emitting layer and both sides of the carrier function layers may further lengthen the device lifetime and improve the efficiency of light emission.

Furthermore, the first and second buffer layers can both be multi-layer structures with gradually changed ingredients. For example, the first buffer layer can be a multi-layer structure in which content of the luminescent material gradually decreases in a direction from the light emitting layer to the first carrier function layer. As an example, the first buffer layer may comprise 2 layers, in which a layer adjacent to the light emitting layer is referred to as a first layer, and a layer adjacent to the first carrier function layer is referred to as a second layer, and the content of the luminescent material in the first layer may be 15%, and the content of the luminescent material in the second layer may be 10%.

Similarly, the second buffer layer can also be a multi-layer structure in which content of the luminescent material gradually decreases in a direction from the light emitting layer to the second carrier function layer. For example, the second buffer layer may comprise 3 layers, which are a first layer, a second layer and a third layer sequentially in a direction from the light emitting layer to the second carrier function layer, and the contents of the luminescent material may be 15%, 10% and 5% sequentially.

The use of a buffer layer with a gradual change in composition can further improve the characteristics of the interface between different materials, thereby further lengthening the life of the device. In addition, by controlling the thickness of each of the plurality of buffer layers such that the total thickness is approximate to the thickness of the single-layer buffer layer, the operating voltage can be kept stable while further lengthening the life of the device.

Figure 3:
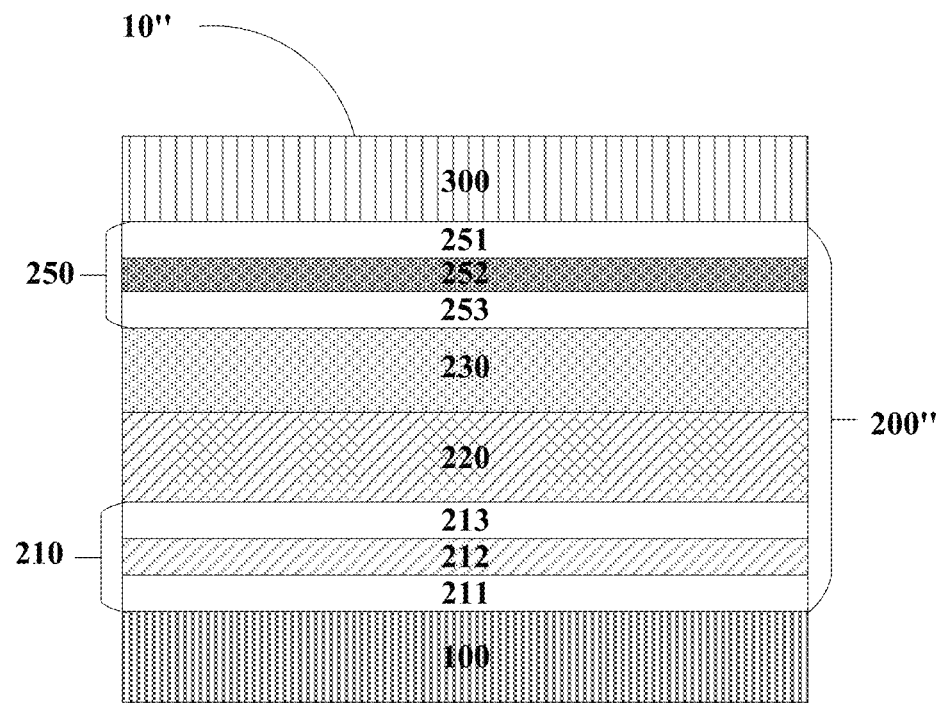
FIG. 3 is a structural diagram of an OLED device according to still other embodiments of the present disclosure.

FIG. 3 is a structural diagram of an OLED device 10" according to still other embodiments of the present disclosure.

The OLED device 10" in FIG. 3 further illustrates an example structure of a carrier function layer of the OLED device 10 in FIG. 1. As shown in FIG. 3, the hole function layer and the electron function layer may each comprises an injecting layer, a transporting layer and a blocking layer, respectively. For example, the hole function layer 210 may comprise a hole injecting layer 211, a hole transporting layer 212 and an electron blocking layer 213. The electron function layer 250 may comprise an electron injecting layer 251, an electron transporting layer 252 and a hole blocking layer 253.

As an example, each of the above carrier functional layers may be selected from the following materials. For example, HATCN (Dipyrazino[2,3-f:2',3'-h]quinoxaline-2,3,6,7,10,11-hexacarbonitride) can be selected for the material of the hole injection layer. NPB (N,N'-bis(naphthalen-1-yl)-N,N'-bis(phenyl)-benzidine) can be selected for the material of the hole transporting layer. Ir(ppz)3(Tris(phenylpyrazole) iridium; tris(1-yl pyrazole)iridium) can be selected for the material of the electron blocking layer. BCP (2,9-dimethyl-4,7-diphenyl-1,10-phenanthroline) can be selected for the material of the hole blocking layer. Bphen (4,7-diphenyl-1,10-phenanthroline) can be selected for the material of the hole blocking layer. LiF can be selected for the material of the electron injecting layer.

The luminescent material may be selected from, for example, MAND (2-methyl-9,10-bis(naphthalen-2-yl)anthracene) as a blue light luminescent material. The luminescent material may be undoped or doped. For example, MAND can be doped with DSA-Ph(1-4-di-[4-(N,N-diphenyl)amino]styryl-benzene). The doping ratio is about 3%.

Luminescent materials emitting red light R, green light G and blue light B can be selected as the luminescent material according to actual needs. And the luminescent material may also be doped according to actual needs. The doping object may be a material that helps emit corresponding fluorescent or phosphorescent light.

Thickness of the above material layers may be within a range from 1 nm to 1500 nm. Different thicknesses may be selected according to different needs. Different materials may also be selected to realize corresponding functions according to actual needs.

It should be noted that FIG. 3 is merely an example structure. It is not necessary for any carrier function layer to comprise all of the function layers. For example, any carrier function layer may comprise only an injecting layer, and does not comprise a transporting layer and a blocking layer; and may also comprise an injecting layer and transporting layer but does not comprise a blocking layer. The same applies to the structures of FIGS. 1 and 2. That is, the structure in which a buffer layer is disposed between the light emitting layer and one or each of the two sides of carrier functional layers in the embodiments of the present disclosure can be applied to any OLED device, regardless of whether the OLED device comprises all of the function layers shown in FIG. 3, i.e., a carrier injecting layer, a transporting layer and a blocking layer.

Therefore, by taking as an example that the first carriers are holes and the second carriers are electrons, the first material layer mentioned in the foregoing embodiments may be either an electron blocking layer, or a hole injecting layer or a hole transporting layer, and the second material layer may be either a hole blocking layer, or an electron injecting layer or an electron transporting layer.

The comparison of the light emitting performances of different structures of the OLED device will be illustrated with reference to Table 1 as follows. Table 1 shows the light emitting performances of different OLED devices: an OLED device without a buffer layer (Comparative Example), an OLED device of which a buffer layer is provided between the light emitting layer and an electron function layer (Example 1), an OLED device of which a buffer layer is provided between the light emitting layer and a hole function layer (Example 2).

TABLE 1 light emitting performances of different structures of the OLED devices in Comparative Example, Example 1 and Example 2.

| | Operating voltage (V) | Current density (mA/cm$^2$) | Brightness (cd/m$^2$) | Efficiency of light emission (cd/A) | Lifetime (hour@ 50 mA/ cm$^2$) |
|---|---|---|---|---|---|
| Comparative Example | 3.2 | 10 | 545 | 5.21 | 21 |
| Example 1 | 3.21 | 10 | 612 | 6.12 | 35 |
| Example 2 | 3.2 | 10 | 605 | 6.05 | 39 |

For the convenience of comparison, the comparative example, example 1 and example 2 are all chosen to be the same basic structure. For example, both example 1 and example 2 employ the structure of FIG. 3, except that the electrode 100 in FIG. 3 corresponds to a cathode in example 1, and corresponds to an anode in example 2. The structure of the comparative example only differs from FIG. 3 in not comprising a buffer layer.

In the comparative example, the substrate is selected to be a transparent glass; the anode is selected to be an indium tin oxide (ITO) film, having a thickness of 150 nm and a surface resistance of 20 Ω/□; all the cathode material is selected to be Al, having a thickness of 120 nm; between the anode and the cathode, there is a hole injecting layer HATCN (10 nm), a hole transporting layer NPB (35 nm), an electron blocking layer Ir(ppz)3 (2 nm), a blue light emitting layer MAND:DSA-Ph(3%)(30 nm), a hole blocking layer CBP(1 nm), an electron transporting layer Bphen (25 nm) and an electron buffer layer LiF(1 nm) sequentially.

In examples 1 and 2, the basic structural layers, materials and thickness of the layers are the same as those of the comparative example, only with a difference that different buffer layers are added.

In example 1, a 1 nm thick buffer layer is set between the light emitting layer and the hole blocking layer. The material of the buffer layer is a mixture of a hole blocking material CBP and a luminescent material MAND:DSA-Ph, wherein the percentage by mass of the luminescent material is about 10%.

In example 2, a 1 nm thick buffer layer is set between the light emitting layer and the electron blocking layer. The material of the buffer layer is a mixture of an electron blocking material Ir(ppz)3 and a luminescent material MAND:DSA-Ph, wherein the percentage by mass of the luminescent material is about 10%.

The aforementioned material layers are manufactured by a vacuum thermal evaporation preparation process. In the evaporation process of the exemplary embodiments, except that Al is processed using a metal cathode mask at the evaporation rate of 0.3 nm/s, the remaining layers were all processed using an open mask at an evaporation rate of 0.1 nm/s, with the target illumination area of the device being 3 mm×3 mm.

For convenience, accelerated measured is adopted when measuring the lifetime of the device, that is, to increase current density. For example, current density of 50 mA/cm$^2$ is adopted during measurement. The lifetime of the device is the time elapsed from the start of the measurement of the lifetime until the brightness of the device decays to 90% of the initial brightness.

According to Table 1, as compared with an OLED device without a buffer layer (comparative example), the light emitting efficiency of an OLED device with a buffer layer (examples 1 and 2) is increased by nearly 20%, and the lifetime is lengthened by more than 50%. That is to say, no matter a buffer layer is provided between a light emitting layer and an electron function layer (example 1) or between a light emitting layer and a hole function layer (example 2), light emitting performance of an OLED device can be effectively improved as long as the buffer layer is provided between a light emitting layer and a carrier function layer. As can be seen from Table 1, the operating voltage is not changed significantly, which means that providing a buffer layer may lengthen the life of the device and improve the efficiency of light emission without having a higher requirement of the operating voltage.

In the above embodiments, by providing a buffer layer from the light-emitting layer to a carrier functional layer on one or two sides of the light-emitting layer, the interface characteristics between different materials can be improved, thereby prolonging the life of the device, and the unused excitons in the luminescent layer are used over again to emit light, thereby improving the efficiency of light emission.

In the following part, a method of manufacturing an OLED device according to some embodiments of the present invention will be described.

Figure 4:
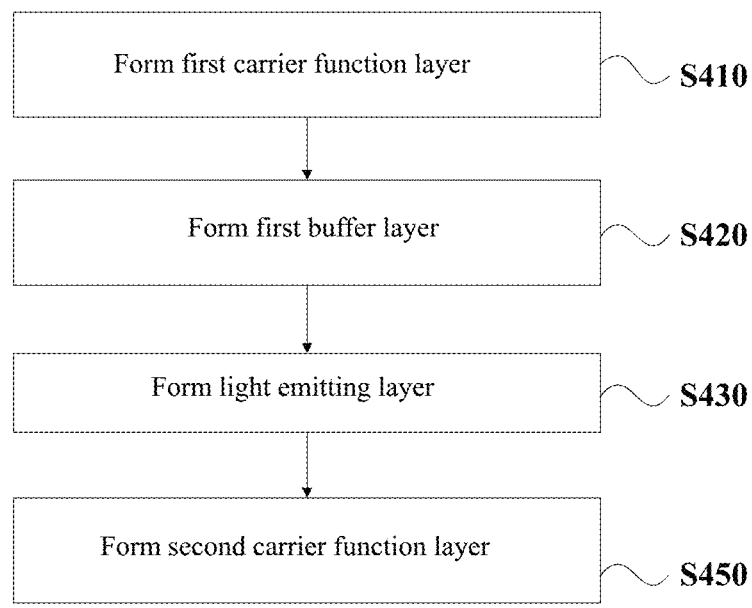
FIG. 4 is a flow chart of a method of manufacturing an OLED device according to some embodiments of the present disclosure.

FIG. 4 is a flow chart illustrating a method of manufacturing an OLED device 10 in FIG. 1. In the OLED device 10 of FIG. 1, a buffer layer is provided between the light emitting layer and a carrier function layer on one side.

The method of manufacturing an OLED device 10 comprises forming an anode 100, a light emitting unit 200 and a cathode 300 sequentially on a substrate. Of course, it is also possible to form a cathode on the substrate first, and then sequentially form a light emitting unit and an anode, for example, in the case of an inverted device. A transparent glass may be selected as the substrate. The material of the anode may be an ITO film. The material of the cathode may be Al.

After an ITO film is formed on the substrate, the substrate can be processed in the following manner. For example, an ITO electrode 100 can be formed by photoetching. Next, the substrate is cleaned, for example, the substrate can be ultrasonically cleaned in deionized water, acetone, and anhydrous alcohol. After the cleaning is completed, the substrate can be blown dry with N$_2$ and treated with O$_2$ plasma. Then, a light emitting unit 200 is formed on the ITO electrode over the processed substrate.

As shown in FIG. 4, forming the light emitting unit 200 comprises: step S410 of forming a first carrier function layer 210; step S420 of forming a first buffer layer 220; step S430 of forming a light emitting layer 230; and step S450 of forming a second carrier function layer 250.

For convenience of description, steps S410-S450 are described below by taking as an example that the first carriers are holes and the second carriers are electrons.

In step S410, a hole injecting layer, a hole transporting layer and an electron blocking layer may be sequentially formed on the ITO electrode. Of course, it is also possible to only form a hole injecting layer or only form a hole injecting layer and a hole transporting layer. That is, the first material layer mentioned in the foregoing embodiments may be either an electron blocking layer, or a hole injecting layer or a hole transporting layer.

In step S420, a first buffer layer is formed on the first material layer. The material of the first buffer layer is a mixture of a first material and a luminescent material. The first material and the luminescent material may have different percentage by mass as needed.

In step S430, a light emitting layer is formed on the first buffer layer. Different kinds of luminescent materials can be used according to actual needs.

In step S450, a hole blocking layer, an electron transporting layer and an electron injecting layer may be sequentially formed over the light emitting layer. Of course, it is also possible to only form an electron injecting layer or only form an electron injecting layer and an electron transporting layer. That is, the second material layer mentioned in the foregoing embodiments may be either a hole blocking layer, or an electron injecting layer or an electron transporting layer.

The above material layers may be selected from the materials listed in the foregoing embodiments. Moreover, as mentioned above, thickness of the above material layers may be within a range from 1 nm to 1500 nm. It should be understood that those skilled in the art can select different materials according to actual needs to achieve the corresponding functions. It is also possible to select a suitable thickness for each material layer according to different needs.

As mentioned above, the aforementioned material layers are manufactured by a vacuum thermal evaporation preparation process. Of course, according to actual needs, printing, spin coating and other processes can also be used instead of vacuum thermal evaporation.

Figure 5:
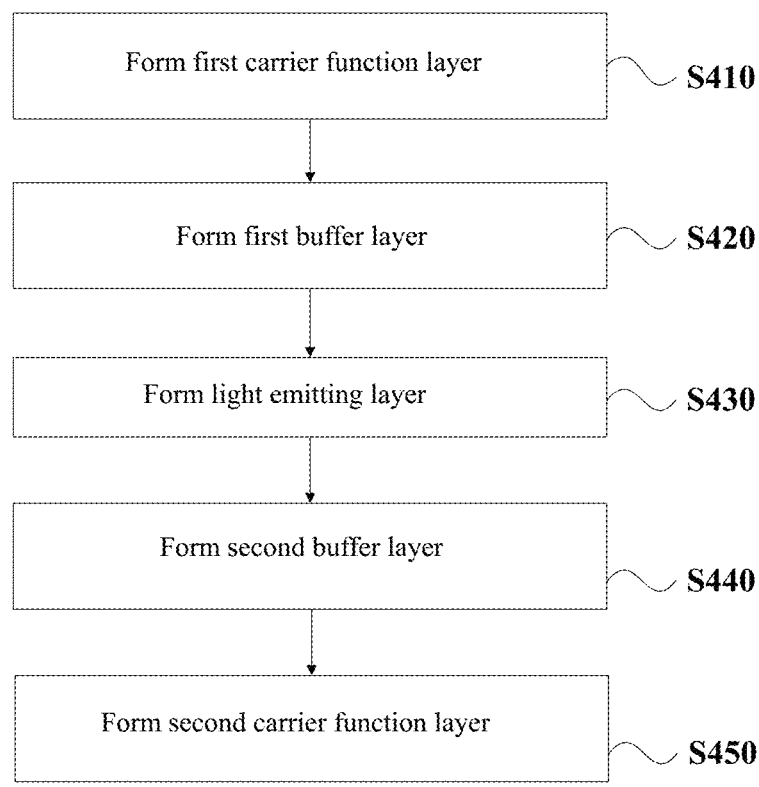
FIG. 5 is a flow chart of a method of manufacturing an OLED device according to some other embodiments of the present disclosure.

FIG. 5 is a flow chart illustrating a method of manufacturing an OLED device 10' according to FIG. 2.

The manufacturing method in FIG. 5 differs from the manufacturing method in FIG. 4 in that the former not only forms a first buffer layer between the light emitting layer and the first carrier function layer but also forms a second buffer layer between the light emitting layer and the second carrier function layer. In other words, a step S440 is added in the flow chart shown in FIG. 4, i.e., to form a second buffer layer, on a basis of the flow chart shown in FIG. 4.

For convenience of description, step S440 is described still by taking as an example that the first carriers are holes and the second carriers are electrons. In step S440, prior to forming an electron function layer (such as a second material layer as an electron injecting layer, an electron transporting or a hole blocking layer), a second buffer layer is formed on the light emitting layer. The material of the second buffer layer is a mixture of a second material and a luminescent material. The second material and the luminescent material may have different percentage by mass according to actual needs. Thickness of the second buffer layer may be within a range from 1 nm to 1500 nm. It will be appreciated that those skilled in the art may select suitable thicknesses for different needs.

As mentioned above, the second buffer layer may be formed using the same preparation process as forming the light emitting layer or the like. For example, a vacuum thermal evaporation preparation process may be adopted. Of course, according to actual needs, printing, spin coating and other processes can also be used instead of vacuum thermal evaporation.

In the above embodiments, regardless of whether it is the first buffer layer or the second buffer layer, the material of the buffer layer is always a mixture of a luminescent material and the material of an adjacent carrier function layer. By using such buffer layer, the interface characteristics between different materials can be improved, thereby prolonging the life of the device, and the unused excitons in the light emitting layer are used over again to emit light, thereby improving the efficiency of light emission. When achieving the above technical effects, no extra cost will be brought for the preparation process, so it is unnecessary to introduce other source materials.

The embodiments of the present disclosure also provide a display device comprising any of the aforementioned OLED devices. The display device may be any product for component having a display function such as OLED panel, mobile phone, tablet computer, television, display, notebook computer, digital photo frame, navigator, etc.

Up to this point, the embodiments of the present disclosure have been described in detail. In order to avoid obscuring the concepts of the present disclosure, some details known in the art are not described. Those skilled in the art can totally understand how to implement the technical solution disclosed here according to the above description.

Although some specified embodiments of the present disclosure have been explained in detail by the examples, those skilled in the art shall understand that the above examples are only intended for making explanation rather than for limiting the scope of the present disclosure. Those skilled in the art shall understand that the above embodiments can be amended or equivalent substitution of part of the technical features can be performed without deviating from the scope and spirit of the present disclosure. The scope of the present disclosure is defined by the following claims.

What is claimed is:

1. An OLED device comprising a light emitting unit between an anode and a cathode, the light emitting unit comprising:

a first carrier function layer for migration of first carriers, the first carrier function layer comprising a first carrier injecting layer, a first carrier transporting layer and a first material layer having a first material, wherein the first material comprises a first blocking material for blocking second carriers, and the first carrier injecting layer comprises a material of Dipyrazino[2,3-f:2',3'-h]quinoxaline-2,3,6,7,10,11-hexacarbonitrile;

the second carrier function layer for migration of second carriers having a polarity different from that of the first carriers, the second carrier function layer comprising a second carrier injecting layer, a second carrier transporting layer and a second material layer having a second material, wherein the second material comprises a second blocking material for blocking the first carriers;

a light emitting layer between the first material layer and the second material layer, the light emitting layer comprising a luminescent material of 2-methyl-9, 10-bis(naphthalen-2-yl)anthracene doped with 1-4-di[4-(N,N-diphenyl)amino]styryl-benzene, wherein doping ratio is about 3%;

a first buffer layer between the light emitting layer and the first material layer, the first buffer layer being a mixed layer containing the luminescent material and the first material, wherein thickness of the first buffer layer is about 1 nm, and percentage by mass of the luminescent material in the first buffer layer is about 10%; and a second buffer layer between the light emitting layer and the second material layer, the second buffer layer being a mixed layer containing the luminescent material and the second material, wherein thickness of the second buffer layer is about 1 nm, and percentage by mass of the luminescent material in the second buffer layer is about 10%.

2. The OLED device according to claim 1, wherein the first buffer layer is a multi-layer structure, in which content of the luminescent material gradually decreases in a direction from the light emitting layer to the first material layer.

3. The OLED device according to claim 1, wherein the second buffer layer is a multi-layer structure in which content of the luminescent material gradually decreases in a direction from the light emitting layer to the second material layer.

4. The OLED device according to claim 1, wherein:
the first material layer comprises a second carrier blocking layer; and
the second material layer comprises a first carrier blocking layer.

5. A display device comprising the OLED device according to claim 1.

6. A method of manufacturing an OLED device, comprising forming on a substrate, an anode, a light emitting unit and a cathode, wherein forming the light emitting unit comprises:

forming a first carrier function layer for migration of first carriers, the first carrier function layer comprising a first carrier injecting layer, a first carrier transporting layer and a first material layer having a first material, wherein the first material comprises a first blocking material for blocking second carriers, and the first carrier injecting layer comprises a material of Dipyrazino[2,3-f:2',3'-h]quinoxaline-2,3,6,7,10,11-hexacarbonitride;

forming a first buffer layer, which is a mixed layer containing a luminescent material of 2-methyl-9, 10-bis(naphthalen-2-yl)anthracene doped with 1-4-di-[4-(N,N-diphenyl)amino]styryl-benzene and a first material, wherein thickness of the first buffer layer is about 1 nm, and percentage by mass of the luminescent material in the first buffer layer is about 10%;

forming a light emitting layer containing the luminescent material; and forming the second carrier function layer for migration of second carriers which have a polarity different from that of the first carriers, the second carrier function layer comprising a second carrier injecting layer, a second carrier transporting layer and a second material layer having a second material, wherein the second material comprises a second blocking material for blocking the first carriers, forming the light emitting unit further comprising forming a second buffer layer between the light emitting layer and the second material layer, the second buffer layer being a mixed layer containing a luminescent material and the second material, wherein thickness of the second buffer layer is about 1 nm, and percentage by mass of the luminescent material in the second buffer layer is about 10%.

7. The method according to claim 6, wherein the first buffer layer is a multi-layer structure in which content of the luminescent material gradually decreases in a direction from the light emitting layer to the first material layer.

8. The method according to claim 6, wherein the second buffer layer is a multi-layer structure in which content of the luminescent material gradually decreases in a direction from the light emitting layer to the second material layer.

9. The method according to claim 6, wherein:
the first material layer comprises a second carrier blocking layer; and
the second material layer comprises a first carrier blocking layer.

* * * * *